United States Patent
Choi

(10) Patent No.: US 8,420,470 B2
(45) Date of Patent: Apr. 16, 2013

(54) METHOD OF FABRICATING A SEMICONDUCTOR DEVICE USING COMPRESSIVE MATERIAL WITH A REPLACEMENT GATE TECHNIQUE

(75) Inventor: Kisik Choi, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 322 days.

(21) Appl. No.: 12/869,341

(22) Filed: Aug. 26, 2010

(65) Prior Publication Data

US 2012/0052666 A1    Mar. 1, 2012

(51) Int. Cl.
*H01L 21/338* (2006.01)
*H01L 21/8238* (2006.01)
*H01L 21/3205* (2006.01)
*H01L 21/4763* (2006.01)

(52) U.S. Cl.
USPC .... 438/183; 438/230; 438/585; 257/E21.444; 257/E21.453

(58) Field of Classification Search ........... 257/E21.453, 257/E21.444; 438/183, 230, 585
See application file for complete search history.

(56) References Cited

U.S. PATENT DOCUMENTS

| | | | | |
|---|---|---|---|---|
| 8,173,530 B2* | 5/2012 | Lee et al. | ...................... | 438/585 |
| 2006/0160317 A1* | 7/2006 | Zhu et al. | ...................... | 438/322 |
| 2007/0077765 A1* | 4/2007 | Prince et al. | .................. | 438/694 |
| 2007/0099414 A1* | 5/2007 | Frohberg et al. | .............. | 438/618 |
| 2008/0124877 A1* | 5/2008 | Pei | ................................. | 438/300 |
| 2008/0286916 A1* | 11/2008 | Luo et al. | ...................... | 438/197 |
| 2010/0330808 A1* | 12/2010 | Richter et al. | ................ | 438/691 |

OTHER PUBLICATIONS

U.S. Appl. No. 12/475,994, filed Jun. 1, 2009.

* cited by examiner

*Primary Examiner* — Matthew W Such
*Assistant Examiner* — Jeremy Joy
(74) *Attorney, Agent, or Firm* — Ingrassia Fisher & Lorenz, P.C.

(57) ABSTRACT

The disclosed method of fabricating a semiconductor device structure forms a dummy gate structure on a substrate, deposits a dielectric material overlying the dummy gate structure in a manner that forms angled sidewalls of the deposited dielectric material outboard the spacers, and conformally deposits a compressive material overlying the deposited dielectric material such that the deposited compressive material forms angled peaks overlying the dummy gate structure. The method continues by forming an upper dielectric layer overlying the deposited compressive material, planarizing the resulting device structure, and exposing the temporary gate element of the dummy gate structure. Thereafter, the temporary gate element is removed, while leaving sections of the deposited compressive material outboard the spacers, and the gate recess is filled with a gate electrode material. The compressive material pulls the upper ends of the spacers apart to facilitate filling the gate recess.

19 Claims, 6 Drawing Sheets

METHOD OF FABRICATING A SEMICONDUCTOR DEVICE USING COMPRESSIVE MATERIAL WITH A REPLACEMENT GATE TECHNIQUE

TECHNICAL FIELD

Embodiments of the subject matter described herein relate generally to semiconductor devices. More particularly, the subject matter relates to a replacement gate technique that can be used while manufacturing transistor devices.

BACKGROUND

The prior art is replete with different techniques and processes for fabricating semiconductor devices such as metal oxide semiconductor (MOS) transistors. In accordance with typical fabrication techniques, a MOS transistor is formed by creating a device structure on a semiconductor substrate, where the device structure includes a gate stack formed on a layer of semiconductor material, and source and drain regions formed in the semiconductor material to define a channel region under the gate stack. Some transistor devices are fabricated using a replacement gate technique; in accordance with this technique, temporary gate material (typically polycrystalline silicon) is removed and then replaced with a different gate material (typically a metal). In this regard, FIG. 1 is a cross sectional view of a semiconductor device structure 100 in a state prior to removal of temporary gate material 102. The temporary gate material 102 is located between two sidewall spacers 104.

Ideally, the sidewall spacers 104 retain their shape after the temporary gate material 102 has been removed. The resulting space between the sidewall spacers 104 can then be filled with the replacement gate material. Unfortunately, the sidewall spacers 104 tend to bend or deform inwardly after removal of the temporary gate material 102. FIG. 2 is a cross sectional view of the semiconductor device structure 100 after the temporary gate material 102 has been removed. FIG. 2 depicts (in an exaggerated manner) how the sidewall spacers 104 deflect inwardly toward each other in the absence of the temporary gate material 102. It becomes difficult or impossible to fill the space 106 with the replacement gate material when the sidewall spacers 104 are deflected in this manner, because the deflected sidewall spacers 104 cause the deposited material to form overhangs near the upper opening, and the overhanging material can "seal" the opening before the space 106 is completely filled. This problem is exacerbated when small manufacturing node technologies (e.g., 32 nm and beyond) are employed to fabricate the semiconductor devices.

Accordingly, it is desirable to have a semiconductor device fabrication process that addresses the limitations and shortcomings of conventional replacement gate processes. In particular, it is desirable to have a semiconductor device fabrication process that improves the effectiveness of the gate material filling step.

BRIEF SUMMARY

A method of fabricating a semiconductor device structure is provided. The method begins by forming a dummy gate structure overlying a layer of semiconductor material. The dummy gate structure includes a temporary gate element having sidewalls and spacers adjacent the sidewalls. The method continues by forming a layer of compressive material overlying the dummy gate structure and positioned near upper ends of the spacers. At least a portion of the temporary gate element is removed, while leaving sections of the compressive material flanking the spacers, resulting in a gate recess between the spacers. The compressive material pulls the upper ends of the spacers apart to define an opening of the gate recess. The gate recess is filled with a gate electrode material while the compressive material flanking the spacers maintains the opening.

Another method of fabricating a semiconductor device structure is also provided. This method begins by providing a substrate comprising semiconductor material and a dummy gate structure formed overlying the semiconductor material, the dummy gate structure comprising a temporary gate element having sidewalls and spacers adjacent the sidewalls. The method continues by depositing, using high density plasma chemical vapor deposition, a dielectric material overlying portions of the semiconductor material and overlying the dummy gate structure. The dielectric material is deposited with angled dielectric sidewalls near upper ends of the spacers. The method conformally deposits a compressive material overlying the deposited dielectric material such that the deposited compressive material exhibits an angled cross-sectional profile overlying the dummy gate structure. Some of the deposited compressive material and some of the deposited dielectric material are then removed to expose the temporary gate element. Thereafter, at least a portion of the temporary gate element is removed, while leaving sections of the deposited compressive material flanking the spacers. This results in a gate recess between the spacers, wherein the deposited compressive material flanking the spacers forces the upper ends of the spacers open such that an opening of the gate recess between the upper ends of the spacers is wider than a nominal lateral width of the gate recess.

Also provided is yet another method of fabricating a semiconductor device structure. This method forms a dummy gate structure on a substrate, where the dummy gate structure includes a temporary gate element having sidewalls, a hard mask cap overlying the temporary gate element, and spacers adjacent the sidewalls. The method continues by depositing a dielectric material overlying the dummy gate structure in a manner that forms angled sidewalls of the deposited dielectric material outboard the spacers. A compressive material is conformally deposited overlying the deposited dielectric material such that the deposited compressive material forms angled peaks overlying the dummy gate structure. An upper dielectric layer is formed overlying the deposited compressive material, to obtain an intermediate device structure. The intermediate device structure is planarized, using the hard mask cap as an endpoint. Thereafter, the hard mask cap is removed to expose the temporary gate element. The temporary gate element is then removed, while leaving sections of the deposited compressive material outboard the spacers, resulting in a gate recess between the spacers. The gate recess is then filled with a gate electrode material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
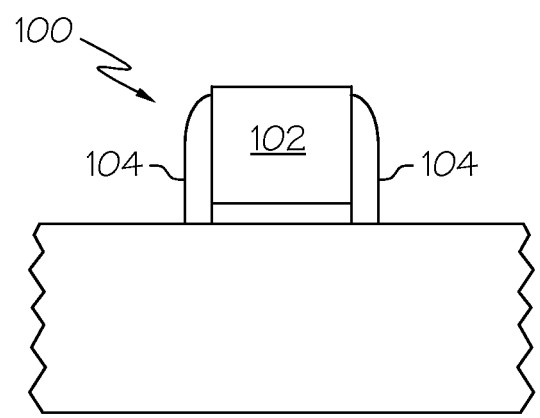
FIG. 1 is a cross sectional view of a semiconductor device structure prior to removal of temporary gate material.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of a feature or element within a consistent but arbitrary frame of reference which is made clear by reference to the text and the associated drawings describing the item under discussion. Such terminology may include the words specifically mentioned above, derivatives thereof, and words of similar import. Similarly, the terms "first", "second", and other such numerical terms referring to structures do not imply a sequence or order unless clearly indicated by the context.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. In particular, the process steps described here can be utilized in conjunction with any semiconductor device fabrication process that forms gate structures for transistors. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

For replacement gate processes, the profile and dimensions of the gate void (which is created after removal of the dummy gate material) should be carefully controlled because the gate void will be filled with the replacement gate material. In this regard, it is desirable to have a profile wherein the area or width of the top opening of the gate void is greater than the area or width of the lower portion of the gate void. A larger top opening facilitates effective completion of the gate filling process, and it alleviates the problems normally associated with the buildup of overhanging material at the opening, which could otherwise hinder the deposition of material in the gate void. The technique and technology described herein can be implemented with a replacement gate process to create wide openings for the gate voids.

Some modern semiconductor device fabrication processes utilize a high-k metal gate (HKMG) transistor structure having a gate insulator formed from a dielectric material with high dielectric constant (i.e., high-k material) and a gate electrode formed from a metal material overlying the high-k dielectric material. HKMG device fabrication processes may employ either a "gate-first" approach or a "gate-last" approach. The gate-last approach is also commonly referred to as the "replacement gate" approach. In one gate-last approach, the high-k dielectric is deposited early in the process, followed by a dummy gate that is later removed and replaced by the final (replacement) gate material. The fabrication process described below represents one exemplary embodiment of such an "early high-k" approach. In another gate-last approach, the dummy gate is created without first depositing the permanent high-k dielectric. In this approach, the high-k dielectric material and the replacement gate material are deposited after the dummy gate is removed. It should be appreciated that the fabrication process described below can be modified to accommodate such a "late high-k" approach. Those familiar with semiconductor fabrication processes will understand how the techniques and technology described herein are applicable to either of these replacement gate approaches.

Figure 3:
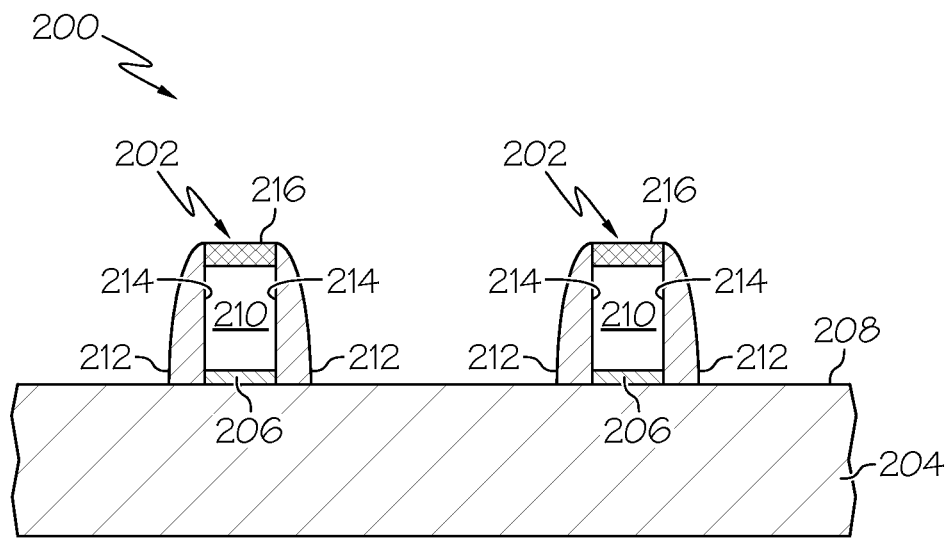
FIGS. 3-12 are cross sectional views that illustrate an exemplary semiconductor device structure and a method of fabricating it.

FIG. 3 depicts the fabrication state of a semiconductor device structure 200 after formation of dummy gate structures 202 overlying a layer of semiconductor material 204. FIG. 3 represents a view from a cross-section taken through the major longitudinal axes of the dummy gate structures 202. Although two dummy gate structures 202 are shown in FIG. 3 (and the other figures), the device structure 200 could include any number, including only one. The device structure 200 is formed using well known techniques and process steps (e.g., techniques and steps related to doping, photolithography and patterning, etching, material growth, material deposition, surface planarization, and the like) that will not be described in detail here.

The semiconductor material 204 is preferably a silicon material as typically used in the semiconductor industry, e.g., relatively pure silicon as well as silicon admixed with other elements such as germanium, carbon, and the like. Alternatively, the semiconductor material 204 can be germanium, gallium arsenide, or the like. The semiconductor material 204 can be either N-type or P-type, but is typically P-type, with wells of the appropriate type formed therein. The semiconductor material 204 may be provided as a bulk semiconductor substrate, or it could be provided on a silicon-on-insulator (SOI) substrate, which includes a support substrate, an insulator layer on the support substrate, and a layer of silicon material on the insulator layer.

For this particular example, each dummy gate structure 202 includes, without limitation: a gate insulator 206 overlying the upper surface 208 of the semiconductor material 204; a temporary gate element 210 overlying the gate insulator 206; and spacers 212 adjacent to the sidewalls 214 of the temporary gate element 210. Although not separately shown in the figures, each dummy gate structure 202 may also include thin sidewall liners (or offset spacers) between the sidewalls 214 and the spacers 212, as is well understood. Each dummy gate structure 202 also includes a sacrificial hard mask cap 216 overlying the temporary gate element 210. This hard mask cap 216, which may be formed from a nitride, a silicide, or other material, is used as part of an etch mask during the formation of the dummy gate structures 202. Each dummy gate structure 202 may also include certain material, such as titanium nitride, over the gate insulator 206. This metal layer protects the gate insulator 206 during the temporary gate removal steps (described below).

The material used for the gate insulator 206 can be a layer of thermally grown silicon dioxide or, alternatively, a deposited insulator such as a silicon oxide, silicon nitride, any kind of high-k oxide such as hafnium oxides, or the like. In preferred implementations, the gate insulator 206 is formed from a high-k gate insulator material. Deposited insulators can be deposited, for example, by chemical vapor deposition (CVD), atomic layer deposition (ALD), low pressure chemical vapor deposition (LPCVD), or plasma enhanced chemical vapor deposition (PECVD). The gate insulator material preferably has a thickness of about 1-10 nm, although the actual thickness can be determined based on the application of the transistor in the circuit being implemented. The material for the temporary gate element 210 is formed overlying the gate insulator material. In accordance with certain embodiments, the material used for the temporary gate element 210 is polycrystalline silicon, although other replaceable materials could be used instead of polycrystalline silicon. In other embodiments, the material used for the temporary gate element 210 includes a thin metal layer underlying polycrystalline silicon. The layer of polycrystalline silicon is preferably deposited, e.g., using LPCVD by the hydrogen reduction of silane. Typically, the polycrystalline silicon will have a thickness within the range of about 50-100 nm. Thereafter, the polycrystalline silicon, the thin metal layer, and the underlying gate insulator material are etched using the hard mask caps 216 as an appropriate etch mask.

The spacers 212 are fabricated in a conventional manner. In this regard, the spacers 212 can be created by conformally depositing a dielectric material over the wafer, where the dielectric material is an appropriate insulator, such as silicon nitride. If nitride is used for the spacers 212, then it will be realized using a "normal" nitride material that has little or no strain-inducing properties. The dielectric spacer material can be deposited in a known manner by, for example, atomic layer deposition (ALD), CVD, LPCVD, semi-atmospheric chemical vapor deposition (SACVD), or PECVD. The layer of dielectric spacer material is deposited to a thickness so that, after anisotropic etching, the spacers 212 formed from the layer have a thickness that is appropriate for any subsequent process steps. In typical implementations, the layer of dielectric spacer material is deposited to a thickness of about 5-50 nm. The process continues, in accordance with an exemplary embodiment, with anisotropic etching of the layer of dielectric spacer material to form the spacers 212, as illustrated in FIG. 3. The layer of dielectric spacer material can be etched by, for example, reactive ion etching (RIE) using a suitable etching chemistry.

Figure 4:
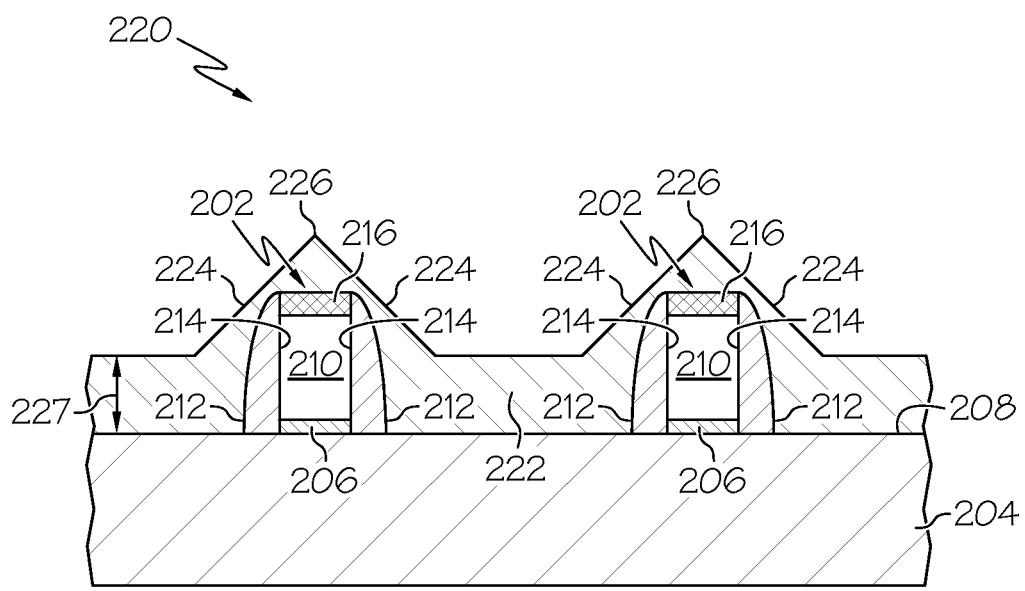

The spacers 212 can be used to protect the underlying semiconductor material 204 during ion implantation associated with the formation of source/drain extension implants, halo implants, and/or deep source/drain implants, as is well understood. Such implant steps could be performed after formation of the device structure 200 shown in FIG. 3, or at a later time in the overall fabrication process. The exemplary process described here continues by depositing a dielectric material onto the substrate. FIG. 4 depicts the resulting semiconductor device structure 220 after deposition of the dielectric material 222. The dielectric material 222 is deposited overlying portions of the semiconductor material 204 and overlying at least a portion of each dummy gate structure 202. Although not always required, FIG. 4 depicts a scenario where the dielectric material 222 covers the dummy gate structures 202.

In certain preferred embodiments, the dielectric material 222 is a material that is commonly used as an interlayer dielectric (ILD). For this example, the dielectric material 222 is a silicon oxide material, such as $SiO_2$. For purposes of etching, the material used for the dielectric material 222 should be distinguishable from the material used for the hard mask caps 216 and the spacers 212. Notably, the dielectric material 222 is deposited in a manner that results in an angled, contoured, peaked, or other appropriate profile, such as that depicted in FIG. 4. As shown in FIG. 4, deposition of the dielectric material 222 forms angled sidewalls 224 located near the upper ends of the spacers 212. The lower portions of the angled sidewalls 224 are outboard the spacers 212, while the upper portions of the angled sidewalls 224 meet to form peaks or apexes 226 overlying the dummy gate structures 202. More specifically, the apexes 226 are located overlying the hard mask caps 216. Accordingly, the dielectric material 222 has a peaked profile for its longitudinal cross-section (as depicted in FIG. 4).

The straight and angled profile of the dielectric material 222 is created by selecting an appropriate deposition technology and by controlling various parameters associated with the deposition process. In this regard, the dielectric material 222 is deposited using high density plasma (HDP) CVD, or a similar technique that forms the angled sidewalls 224 about the dummy gate structures 202. The presence of the dummy gate structures 202 causes the dielectric material 222 to form the angled sidewalls 224 during the HDP CVD process. In an HDP process, plasma enhanced chemical deposition and plasma assisted sputter etching by halogen atoms (argon, helium, or the like) occur simultaneously. As a result, a protruded portion of the deposited material tends to have eroded/angled sides and a sharp peak at the center, as depicted in FIG. 4. The angle (shape) of the peak can therefore be controlled by adjusting the ratio of deposition rate/etch rate with process parameters. In practice, the HDP CVD process is timed such that deposition of the dielectric material 222 stops before the base height of the dielectric material reaches the top of the dummy gate structures 202. In FIG. 4, the base height of the dielectric material is represented by the arrow 227. For purposes of endpoint detection, this base height can be monitored, measured, or otherwise detected during the deposition of the dielectric material 222.

Figure 5:
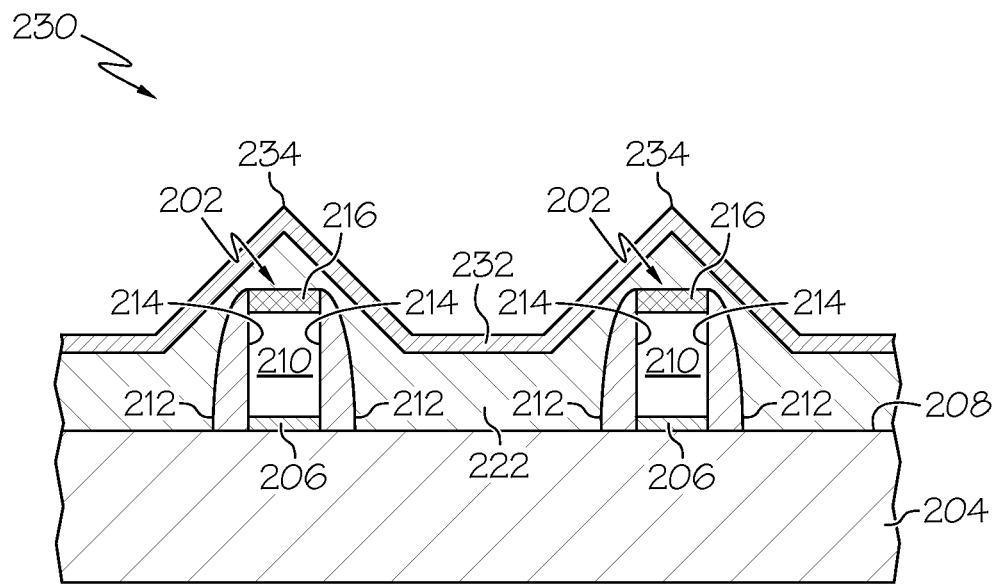

After formation of the dielectric material 222, the process continues by forming a layer of compressive material overlying the dielectric material 222 and overlying the dummy gate structures 202. As used herein, a "compressive material" is a material, such as a silicon nitride or a silicon oxide, that has strain-inducing characteristics that result in stress directed in an inward direction (in other words, the material tends to shrink). FIG. 5 depicts the state of the semiconductor device structure 230 after formation of the layer of compressive material 232. As depicted in FIG. 5, the compressive material is preferably deposited such that it completely covers the underlying dielectric material 222. The compressive material is conformally deposited onto the wafer such that the layer of compressive material 232 generally follows the shape and contour of the underlying dielectric material 222. Thus, at least a portion of the layer of compressive material 232 is positioned near the upper ends of the spacers 212, and the layer of compressive material 232 follows the peaked profile of the dielectric material 222. Accordingly, the layer of compressive material 232 will also exhibit an angled cross-sectional profile overlying the dummy gate structures 202, as illustrated in FIG. 5. In other words, the layer of compressive material 232 will include angled peaks or apexes 234 formed overlying the dummy gate structures 202.

The compressive material used for the device structure 230 may be a compressive silicon nitride material (e.g., SiN or $Si_3N_4$), a compressive silicon oxide material (e.g., $SiO_2$), or the like. If silicon oxide is used for the dielectric material 222, then the layer of compressive material 232 is preferably composed of compressive silicon nitride (silicon nitride is more effective than silicon oxide as a stressing layer because it is a harder material). Alternatively, two different types of silicon oxide could be utilized for the dielectric material 222 and the layer of compressive material 232. The compressive material can be conformally deposited using, for example, CVD, physical vapor deposition (PVD), LPCVD, ALD, or the like. The deposition of the layer of compressive material 232 is controlled or otherwise adjusted to achieve the desired amount of compressive force. In this regard, the thickness of the layer of compressive material 232 will influence the amount of compressive force associated with the layer of compressive material 232 (thicker material results in higher imparted force, thinner material results in less imparted force). For example, the thickness of the layer of compressive material 232 will typically be within the range of about 10-200 Angstroms, although the actual thickness need not always be within this range. In addition, the compressive nature of the deposited material can be controlled by adjusting the amount of hydrogen in the ambient environment during the deposition process. In other words, the stress-imparting characteristics of the deposited material can be "tuned" in this manner.

Figure 6:
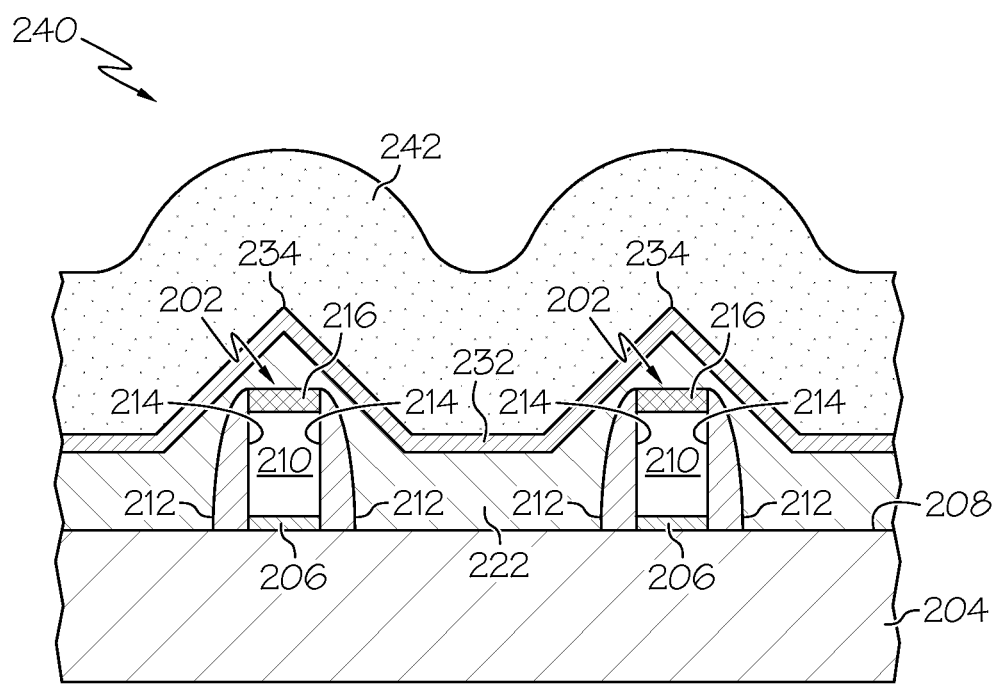

Although other fabrication steps or sub-processes may be performed after the layer of compressive material 232 has been deposited, this example continues by forming a buffer layer overlying the deposited compressive material. FIG. 6 depicts the state of the semiconductor device structure 240 after formation of this buffer layer 242. In certain embodiments, the buffer layer 242 is formed from a dielectric material such as a nitride, silicon oxide, or the like. Although not necessary, this upper dielectric buffer layer 242 could also be formed from a compressive material. The material used for the buffer layer 242 is conformally deposited (using, for example, CVD, PECVD, LPCVD, or any process traditionally used for ILD deposition) over the exposed areas of the device structure 230 (FIG. 5) to fill in spaces and gaps between protruding features. Preferably, the buffer layer 242 is deposited such that its minimum height above the upper surface 208 of the semiconductor material 204 exceeds the height of the apexes 234. This specified height is desirable to provide a uniform surface topology for subsequent planarizing step(s), as described below.

Figure 7:
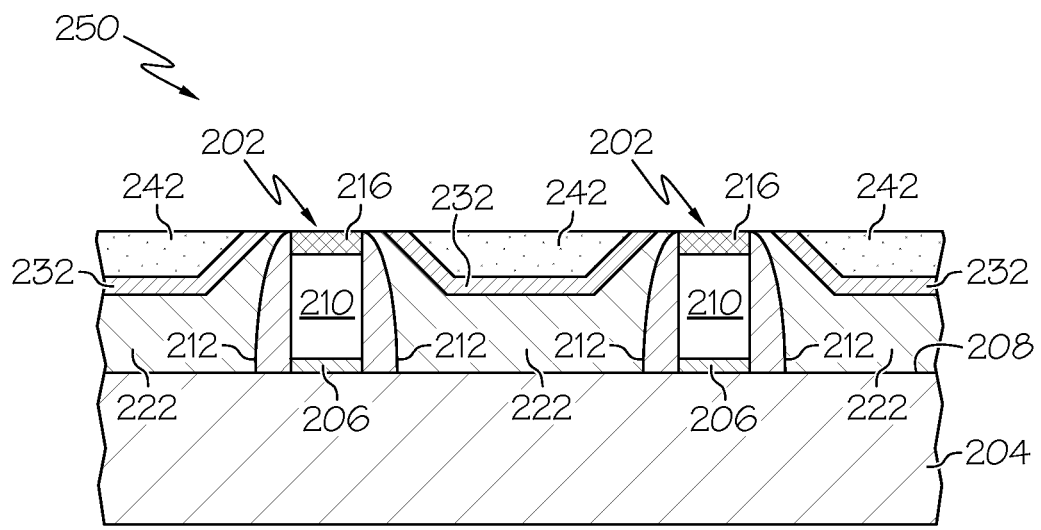

After formation of the buffer layer 242, the manufacturing process may continue by removing some of the buffer layer 242, some of the layer of compressive material 232, and some of the dielectric material 222. FIG. 7 depicts the state of the semiconductor device structure 250 after the removal of these materials. The removal of these materials leaves a portion of the buffer layer 242, a portion of the layer of compressive material 232, and a portion of the dielectric material 222 intact and flanking the dummy gate structures 202, as shown in FIG. 7. Consequently, some of the compressive material remains in place, external to the spacers 212.

The processing of the device structure 240 (FIG. 6) into the device structure 250 (FIG. 7) may involve one or more polishing or planarizing steps. For example, the wafer may be subjected to chemical mechanical polishing to polish and planarize its exposed surface. In practice, the buffer layer 242 will be polished first, then the peaked features of the compressive material 232 and the dielectric material 222 will be polished, with the hard mask caps 216 serving as an endpoint. This example assumes that the material used for the hard mask caps 216 (e.g., nitride) serves as a stop or marker layer during this planarizing step. Accordingly, the device structure 250 shown in FIG. 7 can be obtained by controlling the polishing in an appropriate manner.

Figure 8:
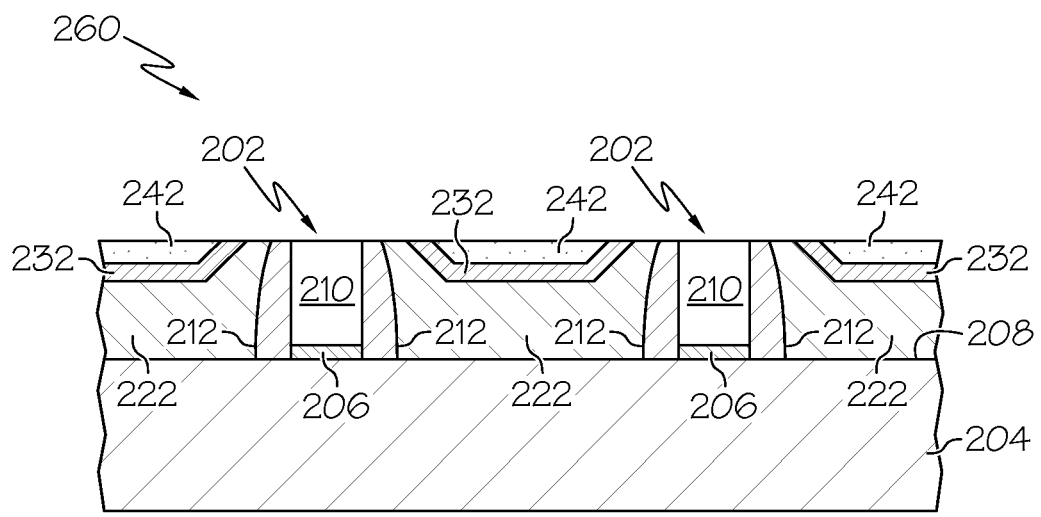

Thereafter, the process may continue by removing: more of the buffer layer 242; more of the compressive material 232; more of the dielectric material 222; the upper end portions of the spacers 212; and the hard mask caps 216. FIG. 8 depicts the state of the semiconductor device structure 260 after the removal of this additional material. The removal of this additional material exposes the temporary gate element 210, while leaving a portion of the buffer layer 242, a portion of the layer of compressive material 232, and a portion of the dielectric material 222 intact and flanking the dummy gate structures 202, as shown in FIG. 8. Consequently, sections of the compressive material 232 and sections of the dielectric material 222 remain in place, external to the spacers 212 and near the upper ends of the spacers 212.

The processing of the device structure 250 (FIG. 7) into the device structure 260 (FIG. 8) may involve one or more polishing, planarizing, and/or etching steps. For example, the wafer may be subjected to further chemical mechanical polishing (typically using a different polishing slurry, a different polishing pad, and/or different polishing control settings relative to those used in the preceding CMP step) to polish and planarize its exposed surface. In certain embodiments, etching could be implemented with CMP to remove the hard mask caps 216. In practice, the temporary gate element 210 serves as the endpoint for this subsequent CMP step. This example assumes that the material used for the temporary gate element 210 (e.g., polycrystalline silicon) serves as a stop or marker layer during this planarizing step. Accordingly, the device structure 260 shown in FIG. 8 can be obtained by controlling the polishing in an appropriate manner.

Figure 9:
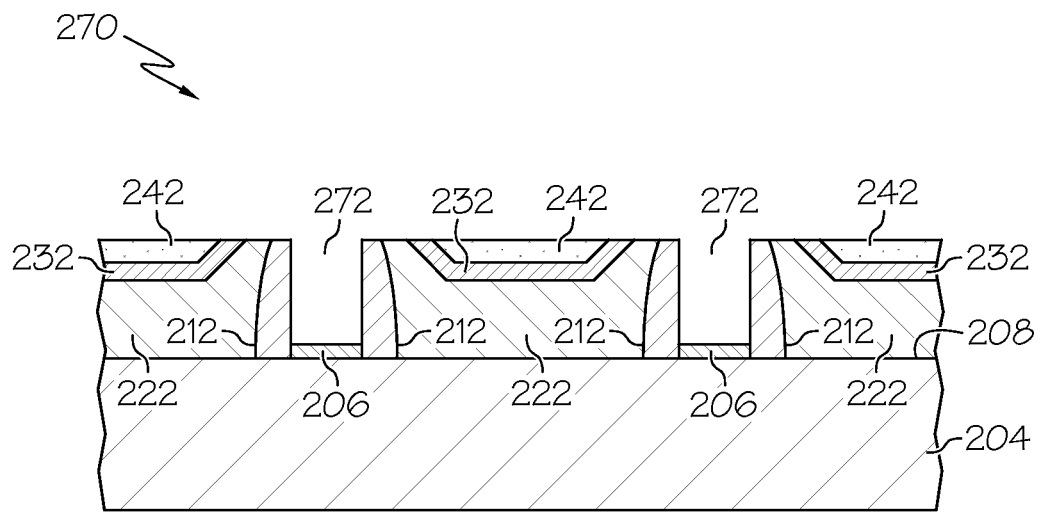

Although other fabrication steps or sub-processes may be performed after the planarizing steps, this example continues by removing at least a portion of each temporary gate element 210, resulting in respective gate recesses. In certain embodiments, the temporary gate elements 210 are completely removed from their dummy gate structures 202. FIG. 9 depicts the state of the device structure 270 after removal of the temporary gate elements 210; the gate recesses 272 are defined between the spacers 212. Notably, the remaining portions of the compressive material 232, the buffer layer 242, and the dielectric material 222 are left intact surrounding the gate recesses 272 and flanking the spacers 212. For this particular embodiment, removal of the temporary gate elements 210 is performed such that at least some of each gate insulator 206 remains in the respective gate recess 272.

The temporary gate element 210 is removed using an appropriate etchant chemistry that selectively etches the material used for the temporary gate element 210 (e.g., polycrystalline silicon). This selective etch has little or no effect on the other exposed device elements, including the buffer layer 242, the layer of compressive material 232, the dielectric material 222, the spacers 212, and the gate insulators 206.

The etchant chemistry, the etching conditions, the duration of the etching process, and other factors can be controlled as needed to ensure that the temporary gate elements 210 are selectively removed in an efficient and effective manner.

Figure 10:
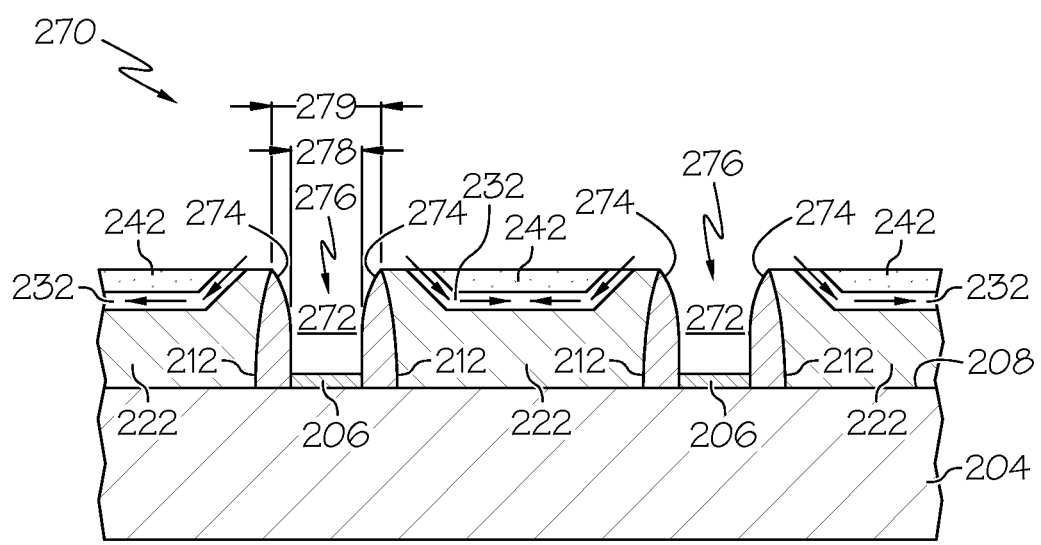

Referring to FIG. 10, the strain-inducing properties of the compressive material 232, along with the location, dimensions, and shape of the compressive material 232, impart pulling forces on the upper ends 274 of the spacers 212. The arrows depicted "inside" the compressive material 232 represent the pulling forces caused by the compressive material 232. In other words, the compressive material 232 flanking the spacers 212 pulls the upper ends 274 apart to define the top opening 276 of each gate recess 272. Thus, the compressive material 232 forces the upper ends 274 open such that the openings 276 are wider than the nominal lateral width of the gate recesses 272. The scale of FIG. 10 is exaggerated to better depict how the compressive material 232 functions to hold the spacers 212 open at their upper ends. In FIG. 10, the double headed arrow 278 indicates the nominal lateral width of the gate recess 272; this nominal lateral width corresponds to the width at and near the base of the gate recess 272. In contrast, the double headed arrow 279 indicates the lateral width of the opening 276, which is wider than the nominal lateral width. In practice, each spacer 212 could be laterally deflected by up to five percent of the nominal lateral width.

Notably, the angled features of the compressive material 232 enhance the transfer of pulling forces to the upper ends 274 of the spacers 212. Moreover, as shown in FIG. 10, the compressive material 232 is located near the top of the spacers 212. In this regard, the flat base of the compressive material 232 is preferably located above the halfway point of the spacers 212. This arrangement is desirable to concentrate the pulling forces at or near the upper ends of the spacers 212, while leaving the base of the spacers 212 unaffected by the compressive stress. In theory, a process that provides true lateral forces would be the most effective, however, such a process is difficult to implement in practice. Accordingly, the practical angled approach presented here (which is derived from the nature of HDP deposition) can still exert sufficient lateral force components to the sidewalls. Moreover, if the entire layer of dielectric material 222 is compressive, then the stress impact on the bottom of the gate recess (near the channel area) may have an adverse effect on the carrier mobility (e.g., compressive stress is undesirable for NFET channels).

Figure 2:
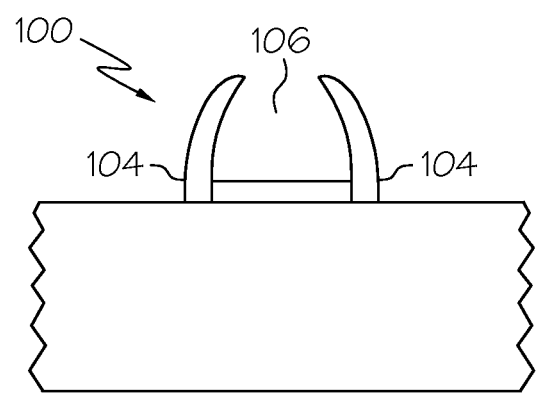
FIG. 2 is a cross sectional view of the semiconductor device structure shown in FIG. 1, after removal of the temporary gate material.
Figure 11:
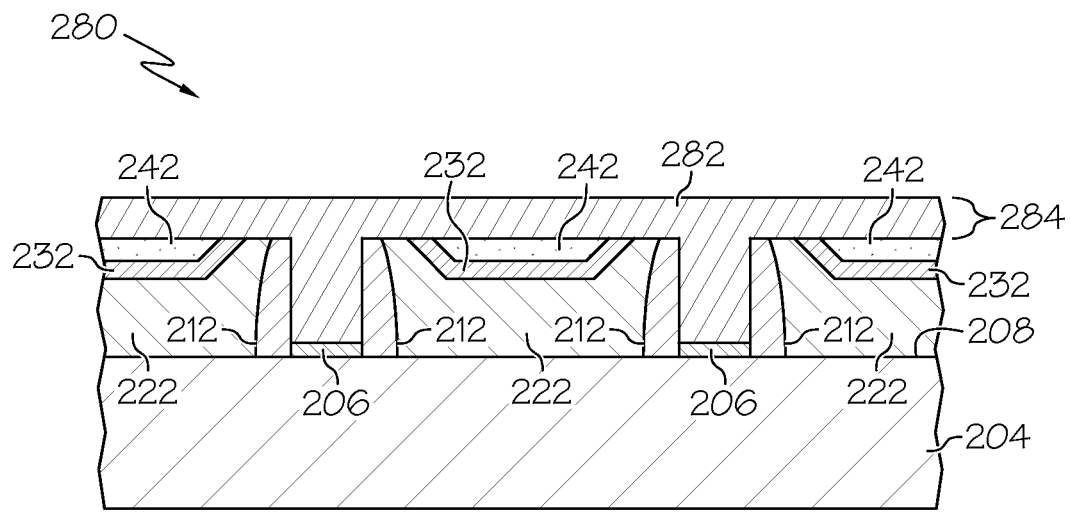

Accordingly, the compressive material 232 helps to maintain the dimensions of the gate recesses 272, helps to minimize or prevent the collapsing phenomena described above with reference to FIG. 2, and makes it easier to fill the gate recesses 272 with the replacement gate material. In this regard, the fabrication process continues by at least partially filling the gate recesses 272 with a gate electrode material, while the compressive material 232 flanking the spacers 212 keeps the opening 276 wider than the nominal lateral width of the gate recesses 272. In certain embodiments, the gate recesses 272 are completely filled with the gate electrode material. FIG. 11 depicts the state of the device structure 280 after the gate recesses 272 have been filled with the gate electrode material 282. For this implementation, the gate electrode material 282 is formed overlying the gate insulator 206 that already resides in the gate recess 272. In alternate embodiments wherein the gate insulator 206 is not fabricated early in the process, gate insulator material can be initially formed in the gate recess 272, followed by the gate electrode material 282.

The gate electrode material 282 may be a metal such as tungsten or titanium, a nitride, or the like. Accordingly, the gate electrode material 282 could be formed by electroplating, CVD, ALD, or PVD. In preferred embodiments, the gate electrode material 282 is conformally deposited on the wafer using CVD or ALD. In this regard, the gate electrode material 282 is deposited in the gate recesses 272 and overlying exposed features of the other device structures (e.g., the exposed surfaces of the buffer layer 242, the compressive material 232, the dielectric material 222, and the spacers 212). FIG. 11 depicts the device structure 280 with excess and overburden portions 284 of the gate electrode material 282 deposited on the wafer. Such excess and overburden portions 284 form when filling the gate recesses 272; this ensures that the gate recesses 272 are completely filled with the replacement gate electrode material 282.

Figure 12:
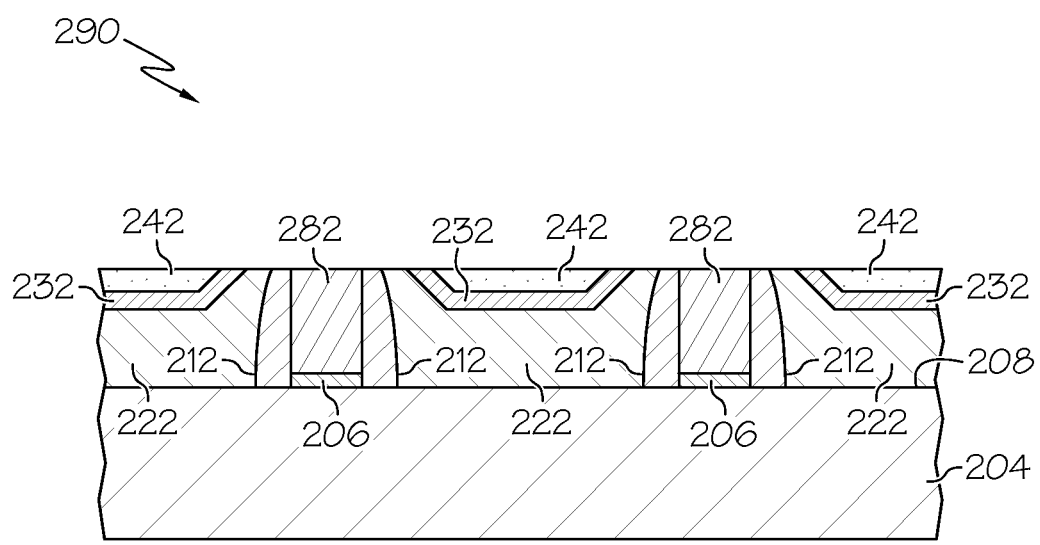

After the gate recesses 272 have been filled, the fabrication process may continue by removing the excess and overburden portions 284 of the gate electrode material 282. FIG. 12 depicts the state of the device structure 290 after removal of the excess and overburden portions 284. The removal of the excess and overburden portions 284 may involve one or more polishing or planarizing steps. For example, the wafer may be subjected to chemical mechanical polishing to polish and planarize its exposed surface. This example assumes that the excess and overburden portions 284 of the gate electrode material 282 are completely polished away, such that the remaining gate electrode material 282 is level with the other features of the device structure 290. In practice, the chemical mechanical polishing process is controlled in an appropriate manner to obtain the device structure 290 shown in FIG. 12.

Although not required, it may be desirable to selectively remove some (or all) of the material other than the replacement gate structure, where the replacement gate structure includes the gate insulator 206 and the gate electrode material 282. Whether or not any of this material is removed will depend on various considerations, such as the intended back-end processes, the design of the semiconductor devices, packaging requirements, and the like. Eventually, any number of known process steps can be performed to complete the fabrication of the MOS transistor device. For the sake of brevity, these process steps and the resulting MOS transistor device are not shown or described here.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device structure, the method comprising:

forming a dummy gate structure overlying a layer of semiconductor material, the dummy gate structure comprising a temporary gate element having sidewalls and spacers adjacent the sidewalls;

forming a layer of compressive material overlying the dummy gate structure and positioned near upper ends of the spacers;

removing at least a portion of the temporary gate element, while leaving sections of the compressive material flanking the spacers, resulting in a gate recess between the spacers, wherein the compressive material flanking the spacers pulls the upper ends of the spacers apart to define an opening of the gate recess; and at least partially filling the gate recess with a gate electrode material while the compressive material flanking the spacers maintains the opening.

2. The method of claim 1, wherein:
the gate recess has a first nominal lateral width defined between the spacers; and
the opening has a second nominal lateral width that is wider than the first nominal lateral width.

3. The method of claim 1, further comprising depositing a dielectric material after forming the dummy gate structure, and before forming the layer of compressive material, the dielectric material being deposited to create a peaked profile for its longitudinal cross-section, the peaked profile having an apex overlying the dummy gate structure.

4. The method of claim 3, wherein forming the layer of compressive material comprises conformally depositing the compressive material overlying the dielectric material such that the layer of compressive material follows the peaked profile.

5. The method of claim 4, further comprising removing some of the compressive material and some of the dielectric material before removing the at least a portion of the temporary gate element, wherein:
removing some of the compressive material, some of the dielectric material, and the hard mask cap exposes the temporary gate element; and
removing some of the compressive material, some of the dielectric material, and the hard mask cap is performed such that the sections of the compressive material and sections of the dielectric material remain intact and external to the spacers.

6. The method of claim 1, wherein the step of at least partially filling the gate recess comprises depositing the gate electrode material in the gate recess and overlying exposed features of the semiconductor device structure.

7. The method of claim 6, further comprising removing excess and overburden portions of the gate electrode material.

8. A method of fabricating a semiconductor device structure, the method comprising:
providing a substrate comprising semiconductor material and a dummy gate structure formed overlying the semiconductor material, the dummy gate structure comprising a temporary gate element having sidewalls and spacers adjacent the sidewalls;
depositing, using high density plasma chemical vapor deposition, a dielectric material overlying portions of the semiconductor material and overlying the dummy gate structure, the dielectric material being deposited with angled dielectric sidewalls near upper ends of the spacers;
conformally depositing a compressive material overlying the deposited dielectric material such that the deposited compressive material exhibits an angled cross-sectional profile overlying the dummy gate structure;
thereafter, removing some of the deposited compressive material and some of the deposited dielectric material to expose the temporary gate element; and
thereafter, removing at least a portion of the temporary gate element, while leaving sections of the deposited compressive material flanking the spacers, resulting in a gate recess between the spacers, wherein the deposited compressive material flanking the spacers forces the upper ends of the spacers open such that an opening of the gate recess between the upper ends of the spacers is wider than a nominal lateral width of the gate recess.

9. The method of claim 8, further comprising at least partially filling the gate recess with a gate electrode material while the deposited compressive material flanking the spacers keeps the opening wider than the nominal lateral width of the gate recess.

10. The method of claim 8, further comprising:
forming a gate insulator layer in the gate recess; and
thereafter, forming a gate electrode material overlying the gate insulator layer.

11. The method of claim 8, wherein the dielectric material is deposited to create a peak overlying the dummy gate structure.

12. The method of claim 8, wherein conformally depositing the compressive material comprises conformally depositing a compressive silicon nitride material overlying the deposited dielectric material.

13. The method of claim 8, wherein removing some of the deposited compressive material and some of the deposited dielectric material comprises planarizing the semiconductor device structure.

14. The method of claim 8, wherein:
the dummy gate structure comprises a high-k gate insulator material underlying the temporary gate element; and
the step of removing at least a portion of the temporary gate element is performed such that at least some of the high-k gate insulator material remains in the gate recess.

15. The method of claim 14, further comprising at least partially filling the gate recess with a gate electrode material, while the deposited compressive material flanking the spacers keeps the opening wider than the nominal lateral width of the gate recess, and such that the gate electrode material overlies the high-k gate insulator material.

16. A method of fabricating a semiconductor device structure, the method comprising:
forming a dummy gate structure on a substrate, the dummy gate structure comprising a temporary gate element having sidewalls, a hard mask cap overlying the temporary gate element, and spacers adjacent the sidewalls;
depositing a dielectric material overlying the dummy gate structure in a manner that forms angled sidewalls of the deposited dielectric material outboard the spacers;
conformally depositing a compressive material overlying the deposited dielectric material such that the deposited compressive material forms angled peaks overlying the dummy gate structure;
forming an upper dielectric layer overlying the deposited compressive material, to obtain an intermediate device structure;
planarizing the intermediate device structure, using the hard mask cap as an endpoint;
thereafter, removing the hard mask cap to expose the temporary gate element;
thereafter, removing the temporary gate element, while leaving sections of the deposited compressive material outboard the spacers, resulting in a gate recess between the spacers; and
at least partially filling the gate recess with a gate electrode material;
the gate recess has a first nominal lateral width defined between the spacers; and
the deposited compressive material pulls the spacers outward to form an opening of the gate recess, the opening having a second nominal lateral width that is wider than the first nominal lateral width.

17. The method of claim 16, wherein removing the hard mask cap comprises planarizing the hard mask cap, some of the deposited compressive material, and some of the formed upper dielectric layer, using the temporary gate element as an endpoint.

18. The method of claim 16, wherein depositing the dielectric material overlying the dummy gate structure comprises depositing a silicon oxide material using high density plasma chemical vapor deposition.

19. The method of claim 16, wherein conformally depositing the compressive material comprises conformally depositing a compressive silicon nitride material.

* * * * *